United States Patent [19]

Hsieh et al.

[11] Patent Number: 5,340,759

[45] Date of Patent: Aug. 23, 1994

[54] METHOD OF MAKING A VERTICAL GATE TRANSISTOR WITH LOW TEMPERATURE EPITAXIAL CHANNEL

[75] Inventors: Chang-Ming Hsieh; Louis L. C. Hsu, both of Fishkill; Seiki Ogura, Hopewell Junction, all of N.Y.

[73] Assignee: International Business Machines Corporation, Armonk, N.Y.

[21] Appl. No.: 113,941

[22] Filed: Aug. 30, 1993

Related U.S. Application Data

[62] Division of Ser. No. 900,038, Jun. 17, 1992, Pat. No. 5,283,456.

[51] Int. Cl.$^5$ ............................................. H01L 21/265
[52] U.S. Cl. ................................... 437/41; 437/909; 437/915
[58] Field of Search .................... 437/21, 41, 909, 915

[56] References Cited

U.S. PATENT DOCUMENTS

| | | | |
|---|---|---|---|
| 4,914,051 | 4/1990 | Huie et al. | 437/59 |
| 4,970,173 | 11/1990 | Robb | 437/29 |
| 4,983,535 | 1/1991 | Blanchard | 437/40 |
| 5,155,052 | 10/1992 | Davies | 437/40 |
| 5,250,449 | 10/1993 | Kuroyanagi et al. | 437/40 |
| 5,273,921 | 12/1993 | Neudeck et al. | 437/41 |

FOREIGN PATENT DOCUMENTS 0151350  8/1985  European Pat. Off. ............ 437/915

Primary Examiner—George Fourson
Assistant Examiner—Richard A. Booth
Attorney, Agent, or Firm—Whitham, Curtis & Whitham

[57] ABSTRACT

A field effect transistor (FET) with a vertical gate and a very thin channel sandwiched between source and drain layers. In a preferred embodiment of the invention, the FET is formed on a silicon on insulator (SOI) substrate with the silicon layer serving as the first layer (e.g., the source layer). A low temperature epitaxial (LTE) process is used to form a very thin (e.g., 0.1 $\mu$m) channel, and a chemically vapor deposited polysilicon layer forms the top layer (e.g., the drain layer). An opening is etched through the three layers to the insulator substrate and its wall is oxidized, forming a gate oxide. Polysilicon is deposited to fill the opening and form the vertical gate.

4 Claims, 4 Drawing Sheets

METHOD OF MAKING A VERTICAL GATE TRANSISTOR WITH LOW TEMPERATURE EPITAXIAL CHANNEL

This application is a divisional of co-pending application Ser. No. 07/900,038, filed on Jun. 17, 1992 now U.S. Pat. No. 5,283,456.

BACKGROUND OF THE INVENTION

1. Field of the Invention

This invention relates to a novel, vertical gate, field effect transistor (FET), and more particularly, to an FET that has a very short channel length.

2. Description of the Prior Art

There have been a number of prior art proposals relating to FET structures with vertical gate geometries. In general, these proposals rely on a diffusion process to form the gate channel. Representative examples of this prior art include the following list of U.S. patents, each of which relates to a double diffusion MOS device.

U.S. Pat. No. 4,970,173 entitled "Method of Making High Voltage Vertical Field Effect Transistor with Improved Safe Operating Area"; U.S. Pat. No. 4,914,051 entitled "Method for Forming a Vertical Power DMOS Transistor with Small Signal Bipolar Transistor"; U.S. Pat. No. 4,983,535 entitled "Vertical DMOS Transistor Fabrication Process"

However, as will be appreciated by those skilled in the art, the dimensions of device layers deposited by silicon epitaxy are limited to values greater than the diffusion length of dopants out of the substrate, where these dimensions can be on the order of a micron under typical high-temperature processing conditions (T > 1000° C).

Thus, prior art proposals for manufacturing field effect transistors with a channel length on the order of 0.1 μm have heretofor relied on the use of special process steps, such as electron-beam or X-ray lithography, in order to provide the required tolerances at this extremely small feature size. However, as will be appreciated by those skilled in the art, the use of such advanced process steps as electron-beam and X-ray increase the manufacturing cost of integrated circuits and increase the turnaround time of the manufacturing process where they must be used.

SUMMARY OF THE INVENTION

An object of this invention is the provision of a novel structure for field effect transistors that can yield devices with a gate channel on the order of 0.1 μm using known state of the art, photolithography process steps. Other objects of the invention include the provision of a field effect transistor that occupies a small area; that has a low parasitic capacitance and will not latch up due to parasitic capacitance; and is relatively immune to alpha particle and cosmic ray strike.

This invention contemplates the provision of a field effect transistor (FET) with a vertical gate and a very thin gate channel sandwiched between source and drain layers. In a preferred embodiment of the invention, the FET is formed on a silicon on insulator (SOI) substrate with the silicon layer serving as the first layer (e.g., the source layer). A low temperature epitaxial (LTE) process is used to form a very thin (e.g., 0.1 μm) gate channel, and a chemically vapor deposited polysilicon layer forms the top layer (e.g., the drain layer). An opening is etched through the three layers to the insulator substrate and its wall is oxidized, forming a gate oxide. Polysilicon is deposited to fill the opening and form the vertical gate. This layered, vertical gate structure provides FET devices with a channel length of 0.1 μm or less, with tight dimensional tolerances (e.g., plus or minus 10 Å), and which can be fabricated using conventional photolithographic process steps. The thickness of the LTE layer determines the channel length and the channel width is determined by the peripheral extent of the vertical gate opening. In the preferred thin-film silicon on insulator embodiment, parasitic capacitance is low, and parasitic latch-up is virtually non-existent. The device is also highly immune to soft errors due to alpha particles and cosmic rays irradiation. Both nMOS and pMOS field effect transistor devices can be realized in the practice of the invention. The substrate of these devices can be accessed, and biased. Therefore there will be no floating body effect as experienced by fully depleted SOI devices. These devices inherently have large channel width-to-length ratio, the performance is better thann any existing FET devices.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
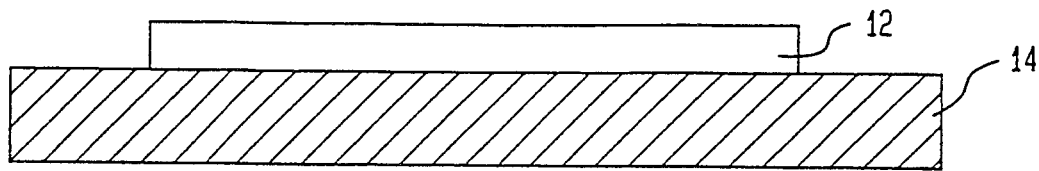
FIGS. 1–10, 10A and 11–12 are views illustrating the steps in fabricating a device in accordance with the teachings of the invention, as well as illustrating the structure at various stages in the process.

Referring now to the drawings, the device in this illustrative embodiment of the invention is a CMOS device, particularly, a nMOS FET. As will be appreciated by those skilled in the art, a similar pMOS FET can be fabricated in accordance with the teachings of the invention by using p-type dopants in place of n-type and vice versa.

As illustrated in FIG. 1, in the preferred embodiment of the invention, a silicon on insulator substrate is used. It comprises a very thin (e.g., 1000 Å) layer 12 of silicon on an oxide base layer 14 support on a wafer (not shown). Any suitable prior art method may be used to form the SOI substrate; preferably a low temperature process of wafer bonding as described in the reference "Si Wafer Bonding With TA Silicide Formation, *Japanese Journal of Applied Physics*, Vol. 30, No. 10A, October 1991, P1 1693–1695, by Atsushi Fukuvoda. The silicon layer 12 is doped with a suitable n+ dopant in this specific exemplary embodiment of the invention. The silicon layer 12 is patterned and etched to form island structure.

Figure 2:
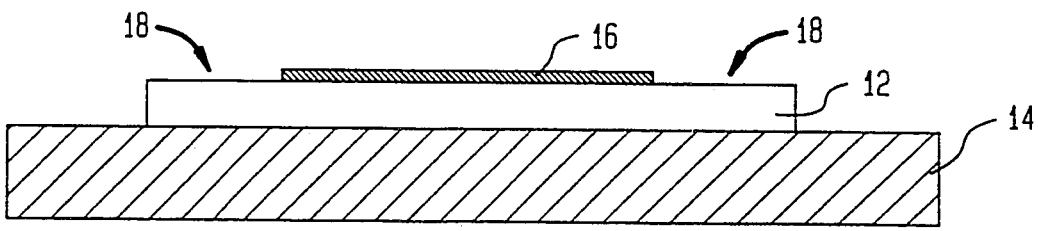

Referring now to FIG. 2, a very thin nitride layer 16 is deposited on the silicon layer 12; the nitride layer is patterned and etched to form an exposed silicon region 18 surrounding a nitride island 16. The region 18, which in this embodiment of the invention will be used for FET source contacts, is annealed.

Figure 3:
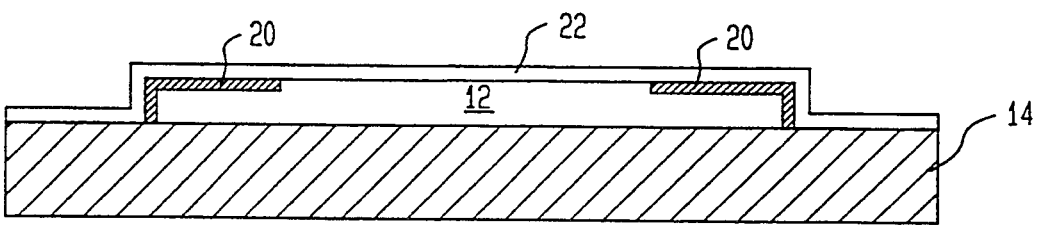

A thermal oxide layer 20 is grown on the exposed silicon region 18 and the nitride layer 16 is thereafter removed. Next, a low temperature epitaxial process is used next to form a thin p-type silicon layer 22 that becomes the very thin channel region. A suitable process is described in "Low-Temperature Silicon Epitaxy by Ultrahigh Vacuum/Chemical Vapor Deposition" by B. S. Meyerson, *Appl. Phys. Lett.* 48 (12), Mar. 24, 1986, pp. 797-799. The thickness of the channel layer 22 is, for example, on the order of 1500 Å and a dopant concentration on the order of $3 \times 10^{17}$ atoms/cm$^3$. The channel doping is adjusted for threshold control and to provide a punch-through protection. The device at this stage is shown in FIG. 3.

Figure 4:
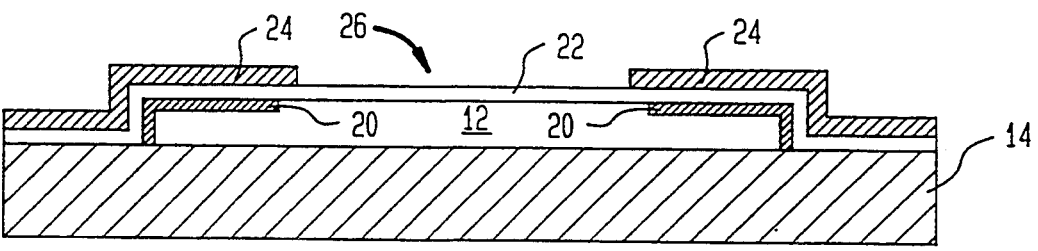

An oxide layer 24 is formed by PECVD process step and then etched to make a window 26 in the oxide layer 24 at the center of the device. This state of the structure is shown in FIG. 4.

Figure 5:
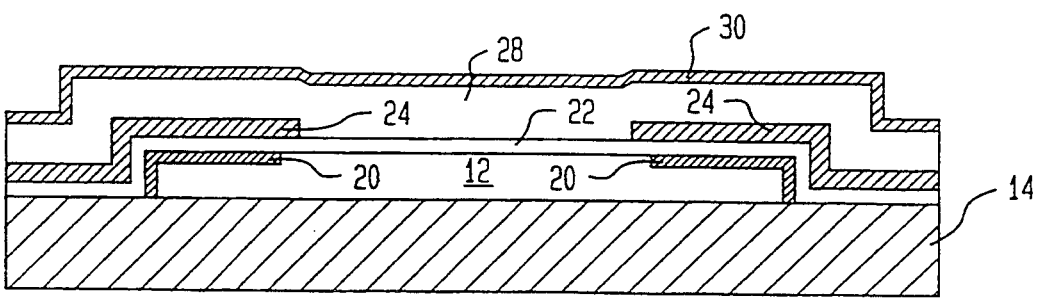

An FET drain is next formed by depositing a layer 28 of polysilicon and doping it with a suitable n-dopant. An oxide layer 30 formed by a high pressure oxide (HIPOX) process is grown over the polysilicon layer 28. The device at this state is shown in FIG. 5.

Figure 6:
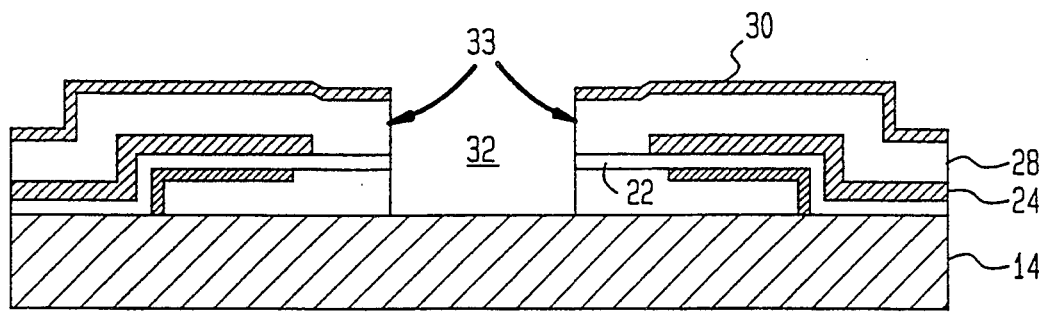

Referring now to FIG. 6, the oxide layer 30 is patterned and an opening indicated by the general reference numeral 32 in FIG. 6 is etched using suitable conventional process steps through all the layers, extending to the upper surface of oxide layer 14. A gate oxide 33 is grown as a thin oxide (about 60 Å equivalent thickness, for example) on the wall of the opening 32.

Figure 7:
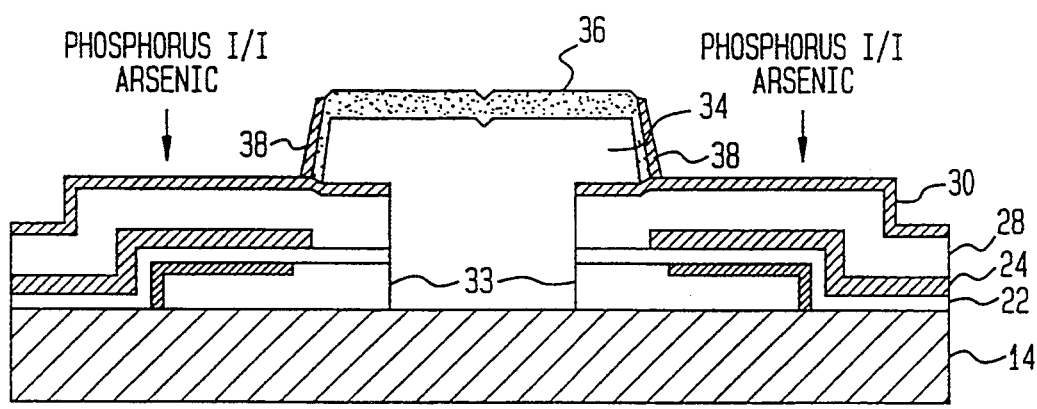

Referring now to FIG. 7, a gate structure 34 is formed by depositing an n+ polysilicon in a CVID step, which fills the opening 32 and extending up over the oxide layer 30. A conventional dry-etch process is used to define the gate electrode, a thin oxide layer is grown over the exposed portion of the polysilicon gate structure 34 and a thin nitride is deposited over the oxide layer using conventional process steps to form an oxide/nitride layer 36. After gat etch, the sidewalls 38 of the exposed gate structure are oxidized by a HIPOX step and a phosphorus or arsenic implant is then made in the drain region, layer 28. The structure at the completion of these process steps is shown in FIG. 7.

Figure 8:
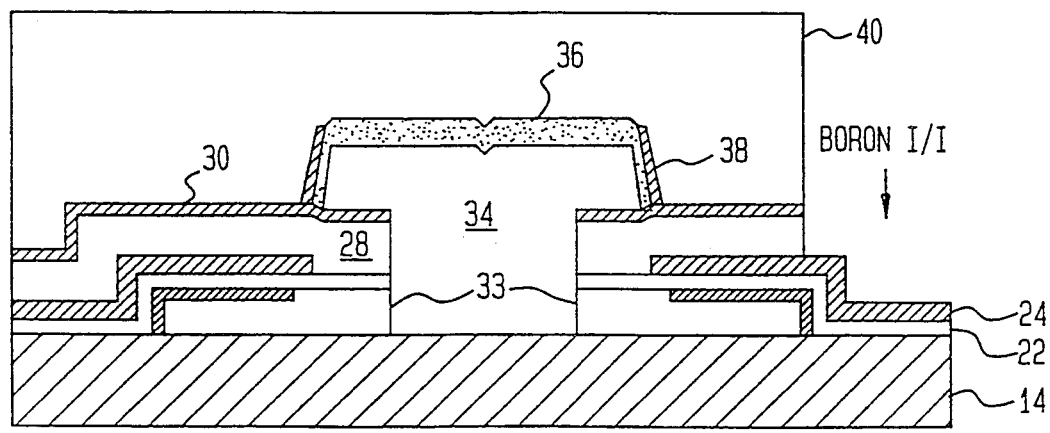

Next, a block-out mask 40 is formed, and an opening made to the substrate layer 22 in the intended substrate contact region. A boron ion implant is made in this region as indicated in FIG. 8.

Figure 9:
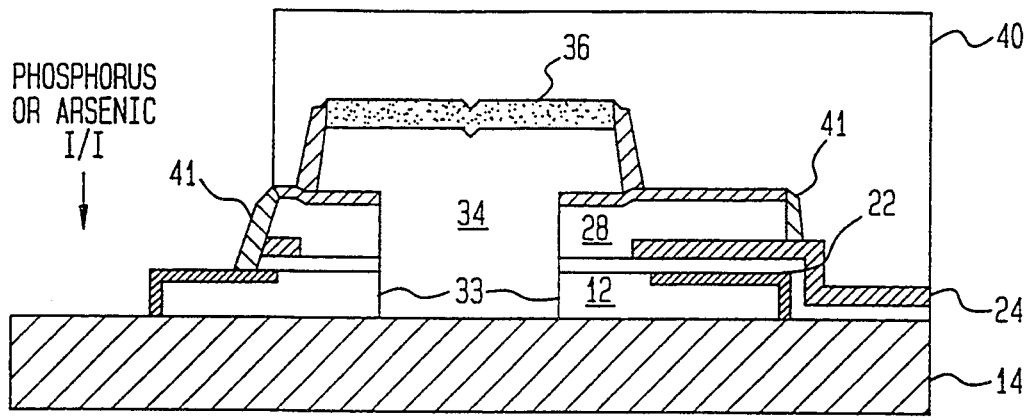

A block photo-resist 40 is then reformed and repatterned, and a contact opening is etched overlying the intended source contact region. Phosphorus or arsenic ions are implanted to this region layer 12 to enhance their conductivity, as indicated in FIG. 9.

The structure is then annealed which results in a n+ doping to the source and drain layers, diffusing about 250 Å from each layer into the low temperature epitaxial channel layer 22, to produce an effective channel length of about 1000 Å. A high pressure oxide 41 is grown over the exposed silicon sidewalls.

Figure 10:
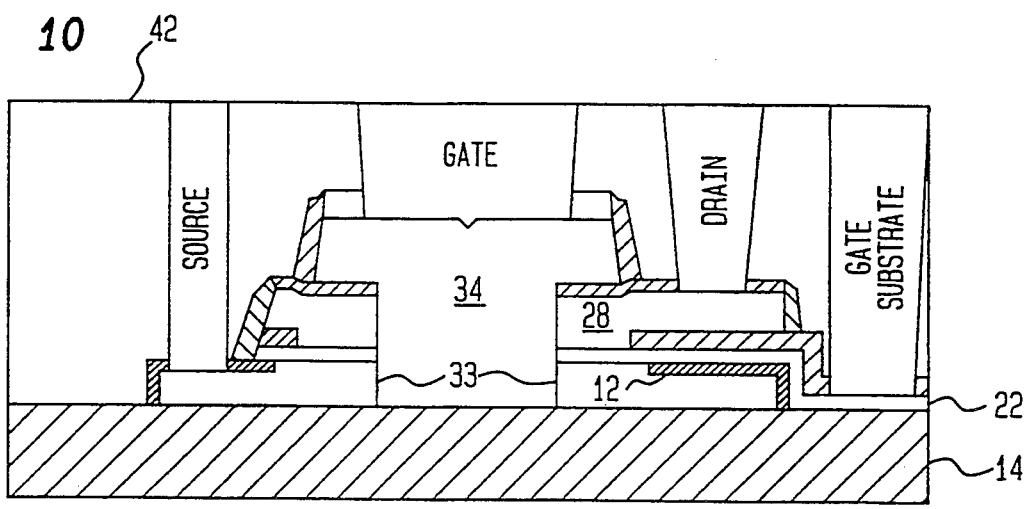
Figure 10A:
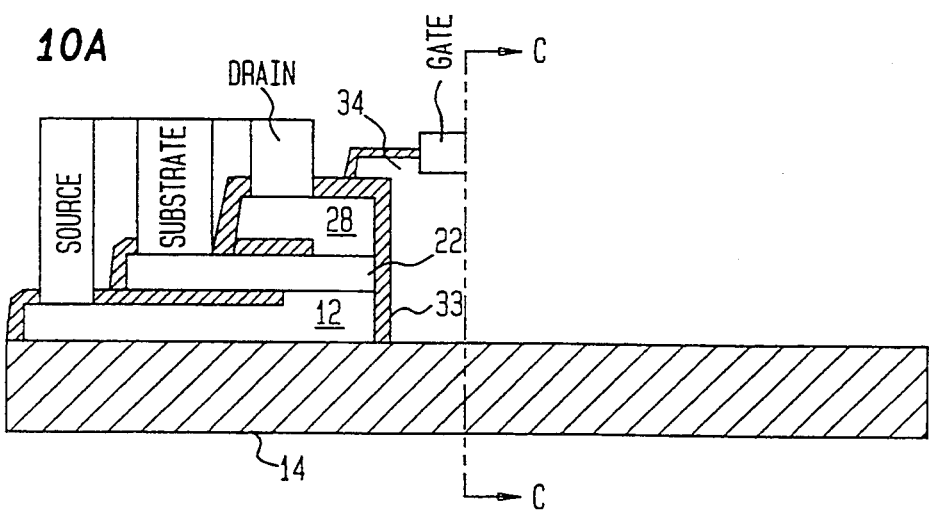

Referring now to FIG. 10, using conventional process steps, a quartz layer 42 is formed to cover the structure. Openings are formed in the quartz and the various layers for the contact studs, which are then formed and the upper surface of the device is planarized. The source, gate, drain, and substrate contacts are marked as such. FIG. 10A is a sectional view, similar to FIG. 10, showing the shared gate structure illustrated in plan view in FIG. 12, the device being symmetrical about the centerline C—C.

Figure 11:
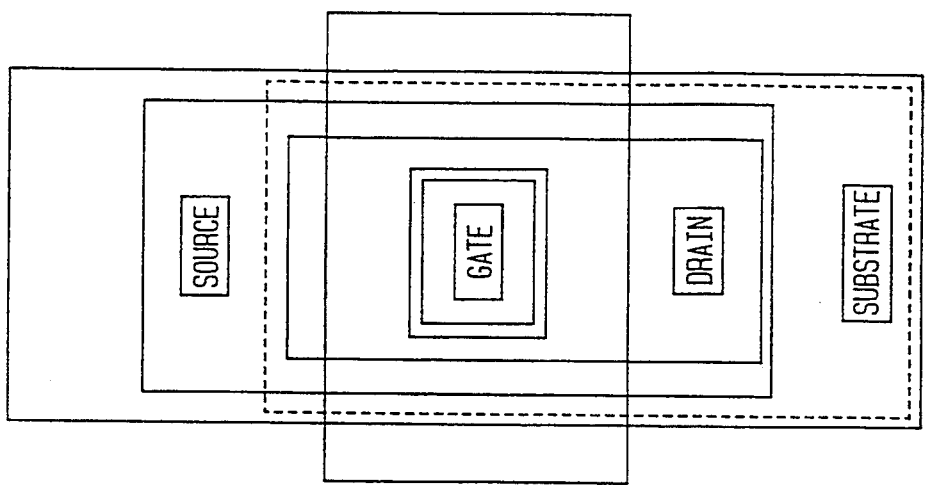
Figure 12:
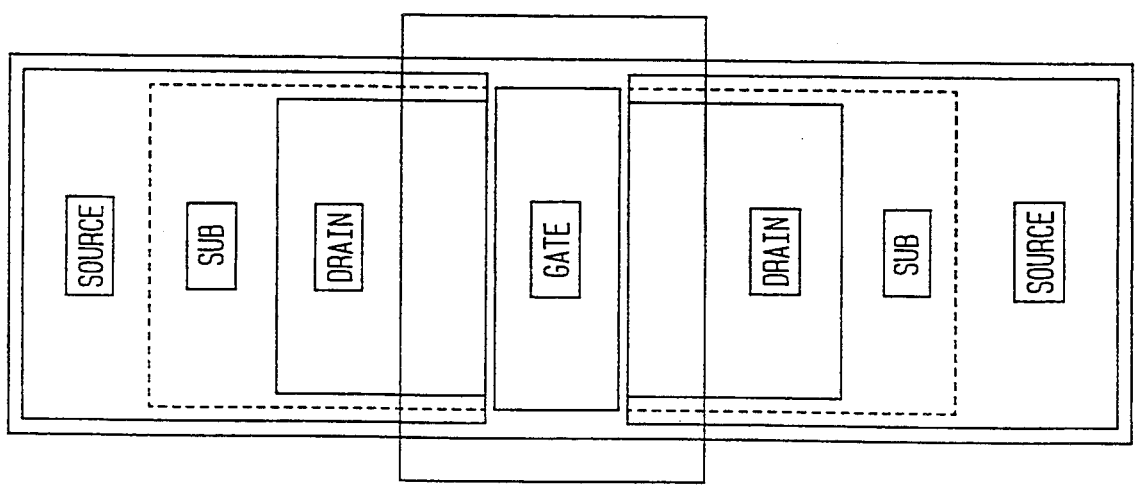

It will be appreciated that the vertical gate FET just described can be designed so that it has an enclosed topology as shown in FIG. 11, with a single gate for each device. Further, the device can be easily designed so that the gate structure is shared by two FET devices, as shown in FIG. 12.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of fabricating a vertical field effect transistor on a silicon-on-oxide substrate comprising the steps of:

forming a source layer in the silicon layer of the silicon-on-oxide substrate;

forming by a low temperature epitaxial process a channel substrate layer overlying said source layer;

forming a drain layer overlying said channel substrate layer by a chemical vapor deposition process;

etching an opening through said source layer, said gate channel layer, and said drain layer to expose a source layer edge, a gate channel layer edge and a drain layer edge;

forming a gate dielectric layer covering said source layer edge, said gate channel layer edge, and said drain layer edge; and forming a conductive gate structure in contact with said gate dielectric layer and extending perpendicularly with respect to said source layer, said gate channel layer, and said drain layer.

2. A method of fabricating a vertical gate field effect transistor on a silicon-on-oxide substrate as in claim 1, including the further steps of:

ion implanting a region in said channel substrate layer and connecting a substrate contact to said channel substrate layer ion implanted region;

ion implanting a region in said source substrate layer and connecting a source contact to said source substrate layer ion implanted region;

ion implanting a region in said drain substrate layer and connecting a drain contact to said drain substrate layer ion implanted region.

3. A method of fabricating a pair of field effect transistors with a common vertical gate on a silicon-on-oxide layer, comprising the steps of:

forming a source layer in the silicon layer of the silicon-on-oxide layer;

forming a channel substrate layer by a low temperature epitaxial process overlying said source layer;

forming a drain layer;

forming a vertical opening in said source layer, said channel substrate layer, and said drain layer, said opening separating said source layer, said channel substrate layer, and said drain layer into two electrically isolated structures with an edge of each layer aligned along opposing walls of said opening;

forming a gate dielectric layer on said opposing walls of said opening;

forming a vertical conductive gate structure in said opening in contact with said gate dielectric layer, said gate structure being common to said two electrically isolated structures.

4. A method of fabricating a pair of field effect transistors with a common vertical gate on a silicon-on-oxide layer as in claim 3, including the additional steps of:

ion implanting a region in said channel substrate layer and connecting a substrate contact to said channel substrate layer in each of said two electrically isolated structures;

ion implanting a region in said source substrate layer and connecting a source contact to said source substrate layer ion implanted region in each of said two electrically isolated structures;

ion implanting a region in said drain substrate layer and connecting a drain contact to said drain substrate layer ion implanted region in each of said two electrically isolated structures.

* * * * *